United States Patent [19]

Mattson et al.

[11] Patent Number: 5,198,634
[45] Date of Patent: Mar. 30, 1993

[54] PLASMA CONTAMINATION REMOVAL PROCESS

[76] Inventors: Brad S. Mattson, 19251 Black Rd., Los Gatos, Calif. 95030; Ralph S. Martin, 1582 S. Wolfe Rd., Sunnyvale, Calif. 94087

[21] Appl. No.: 526,574

[22] Filed: May 21, 1990

[51] Int. Cl.⁵ .................................................. B23K 9/00
[52] U.S. Cl. ............................ 219/121.43; 219/121.44; 156/646; 156/345
[58] Field of Search ................. 219/121.43, 121.44, 219/121.59, 121.49; 156/345, 646, 643; 427/34; 204/298.37, 298.38

[56] References Cited

U.S. PATENT DOCUMENTS

| | | |
|---|---|---|
| 3,615,956 | 10/1971 | Irving et al. .................. 156/17 |
| 3,705,055 | 12/1972 | Christensen et al. .......... 117/212 |
| 3,837,856 | 9/1974 | Irving et al. .................. 96/36.2 |
| 3,867,216 | 2/1975 | Jacob ............................ 156/2 |
| 3,879,597 | 5/1975 | Bersin et al. ................. 219/121 P |
| 3,951,843 | 5/1976 | Jacob ............................ 252/187 R |
| 4,253,907 | 3/1981 | Parry et al. .................. 219/121.43 |
| 4,304,983 | 12/1981 | Pierfederici ................. 219/121 PG |
| 4,357,203 | 11/1982 | Zelez ............................ 156/643 |
| 4,370,195 | 1/1983 | Halon et al. ................. 156/643 |
| 4,417,948 | 11/1983 | Mayne-Banton et al. ..... 156/643 |
| 4,443,409 | 5/1984 | Saccocio et al. ............. 422/186.04 |
| 4,474,621 | 10/1984 | Saccocio et al. ............. 134/1 |
| 4,529,860 | 7/1985 | Robb ............................ 219/121.43 |
| 4,540,466 | 9/1985 | Nishizawa .................... 156/643 |
| 4,555,303 | 11/1985 | Legge et al. ................. 156/643 |
| 4,673,456 | 6/1987 | Spencer et al. .............. 156/345 |
| 4,687,544 | 8/1987 | Bersin .......................... 156/643 |
| 4,689,112 | 8/1987 | Bersin .......................... 156/643 |
| 4,699,689 | 10/1987 | Bersin .......................... 156/643 |
| 4,705,595 | 11/1987 | Okudaira ..................... 156/643 |
| 4,718,974 | 1/1988 | Minaee ......................... 156/643 |
| 4,718,976 | 1/1988 | Fujimura ...................... 156/643 |
| 4,736,087 | 5/1988 | Whitlock et al. ............. 219/121 PG |
| 4,804,431 | 2/1989 | Ribner .......................... 156/345 |
| 4,812,201 | 3/1989 | Sakai et al. .................. 156/643 |
| 4,836,902 | 6/1989 | Kainitsky et al. ............ 204/192.32 |

Primary Examiner—Mark H. Paschall
Attorney, Agent, or Firm—Skjerven, Morrill, MacPherson, Franklin & Friel

[57] ABSTRACT

A unique process for the removal of organic polymer photoresist and contaminants from the surface of substrates such as semiconductor wafers is disclosed. The process uses a preferred operating power to pressure ratio (where power is measured in watts per $cm^3$ of plasma and pressure in torr) of less than about 0.150. Pressures of from 10 to 50 torr, and power input of from 200 to 500 watts per cathode can be used to minimize radiation damage to the substrate, and avoid the necessity of using remotely generated plasmas. Additionally, the process minimizes device contamination by post-strip residues (organic and/or inorganic), since only a deionized water rinse is required. Processing time is also reduced.

31 Claims, 1 Drawing Sheet

PLASMA CONTAMINATION REMOVAL PROCESS

BACKGROUND OF THE INVENTION

This invention generally relates to processes for the removal of undesirable material from a substrate surface, and more specifically to a process for the removal of organic materials such as photoresist and contaminants in the photoresist and on the surface of the substrate, which substrate is used for the production of semiconductor devices. The process is especially effective for quickly stripping such materials without significant radiation damage to the substrate. It is thus particularly applicable to automated wafer processing where speed is critical, but effective removal of undesirable materials may not be sacrificed.

Photoresist films are used to mask underlying layers during an etch process. During the etch process, contamination is introduced from several sources, such as from the photoresist itself, from the etched material, and from the etch process by-products. After the etch process is complete, the photoresist is removed.

Photoresist removal was once accomplished by wet chemical means using various acids and solvents, however, dry processing has become the preferred means for reasons of process cleanliness, operator safety, and hazardous waste disposal. Numerous means for dry removal of organics are known.

It may be noted that the terms organic polymer removal, photoresist removal, photoresist etching, photoresist stripping, ashing, plasma cleaning, plasma treatment, dry processing, and gas plasma vapor etching have been used more or less interchangeably in the prior art.

Early dry processes (U.S. Pat. Nos. 3,615,956, 3,705,055, 3,837,856) taught the use of radio frequency (RF) excitation of oxygen gas at pressures of 0.5 to 10.0 torr to produce oxygen radicals and ions which chemically attack the organics to form volatile products such as carbon monoxide, carbon dioxide, water vapor, and low molecular weight organics Subsequently, improved processes (U.S. Pat. Nos. 3,867,216, 3,879,597, 3,951,843, 4,304,983, 4,443,409, 4,474,621) were proposed, variously adding halocarbons to the oxygen reactant, shielding the substrates from direct contact with the ions produced in the plasma, and directing the reactant gas flow in a jet stream at the substrates. In one particular case (U.S. Pat. No. 3,951,843) it is claimed that tin contamination present in photoresist can be removed as volatile tin tetrachloride ($SnCl_4$). The rate of removal of organic materials in these processes is relatively slow and nonuniform, but processing substrates in batches of up to 50 pieces at one time helped to make the processes acceptable in a production environment. Some of these systems are referred to as "barrel" etch systems because the wafers are processed within a barrel-like container.

As etching processes became more aggressive, post-etch photoresist stripping became more difficult because highly cross-linked polymers were formed in the photoresist during ion bombardment-type dielectric and metal etch processes. The removal of these highly cross-linked polymers has been accomplished (U.S. Pat. Nos. 4,357,203 and 4,370,195) by sputter-etch techniques and by reduction in a hydrogen plasma. These techniques, however, require treatment times of up to one hour to remove very small amounts of material, and are, therefore, not suited to the mass production of semiconductor or other devices.

More recently, there has been a move away from batch type barrel etch systems toward single wafer systems because the latter are more readily adapted to full automation of the loading and unloading of substrates. Single substrate processing requires much higher process rates in order to compete on an economic basis with batch processing, but it was feared that higher rates of reaction would also require higher RF power levels to accomplish the same degree of stripping in a shorter time. Higher RF power would mean a more aggressive plasma environment with more ion bombardment and stronger UV exposure of the substrates, which are not desirable because of the surface damage and charge-trapping that they can cause.

In order to generate sufficient reactive species without generating radiation damage, RF excitation of the process gas mixture has been replaced by UV excitation (U.S. Pat. No. 4,540,466) or microwave excitation (U.S. Pat. Nos. 4,673,456, 4,705,595, 4,718,976, 4,736,087, 4,804,431 4,836,902) or a combination of UV and microwave excitation (U.S. Pat. Nos. 4,687,544, 4,689,112, 4,699,689, 4,718,974). In each case, one of the stated objectives was to isolate the substrates being processed from direct exposure to ions formed in the high intensity plasma. These processes are sometimes referred to as "remotely excited" or "downstream" processes. By varying process temperatures, gas flows, pressures, and excitation power, stripping rates between 0.5 and 3.0 microns per minute are said to be achieved.

In addition to their claim of preventing ion contact with the substrates, the remotely excited processes typically teach that UV exposure of the substrates should be limited or prevented altogether. On the other hand, processes have also been proposed wherein it is stated that UV exposure is desirable (U.S. Pat. Nos. 4,417,948, 4,687,544, 4,689,112, 4,699,689) as a process initiating or rate enhancing feature.

Oxygen and ozone source processes have also been proposed which use relatively high (atmospheric level) process pressures to achieve high removal rates (1.0 to 3.0 microns per minute) of carboncontaining films (U.S. Pat. Nos. 4,555,303 and 4,812,201)

In all of this prior art, however, it is necessary to follow the strip process with a substrate rinse in acid or solvent to effect the removal of nonvolatile residues, particularly chemically resistant polymers and metal and alkali earth metal contaminants which have been left on the surface or driven or diffused into the substrate surface as a result of exposure to the strip process.

SUMMARY OF THE INVENTION

It is the object of this invention to provide a plasma cleaning process for the removal of organic polymer and photoresist materials, as well as normally nonvolatile residues from such materials, which process is suitable for a high rate, automated production environment, avoids substrate damage due to aggressive strip process environments, and requires no post-plasma processing beyond a simple DI water rinse.

In one embodiment of the invention, the process comprises the steps of disposing a substrate in a reaction chamber, the chamber including a source of electromagnetic radiation, filling the chamber with plasma forming gasses, exposing the gasses to the radiating electromagnetic source at a power sufficient to create a plasma therefrom in contact with a surface of the substrate and maintaining an operating pressure such that the energy to pressure ("E/P") ratio of power used (as measured in watts per $cm^3$ of the plasma) to the pressure (as measured in torr) is about 0.150 or less to clean undesirable material from the surface of the substrate.

It is preferred that an E/P ratio of from 0.017 to 0.125 be used, and it is especially preferred that the chamber is filled with plasma forming gasses to a pressure of from about twenty to about thirty torr, and that radiation powers of from about 200 to about 500 watts per cathode be used in order to maximize removal of undesirable materials and minimize radiation damage to the substrate.

In a further preferred embodiment of the process a radio frequency (RF) transmitter is used to create the plasma, and gasses including a fluorine containing compound are used to promote removal of residual materials. In such a case the process may further comprise the step of rinsing the substrate in deionized water to remove soluble metal compounds formed during the plasma cleaning process.

BRIEF DESCRIPTION OF THE DRAWING

The invention will be better understood by reference to the attached FIGURE which shows the general arrangement of an apparatus in which the inventive process may be practiced.

DETAILED DESCRIPTION OF THE PREFERRED EMBODIMENT

Figure 1:
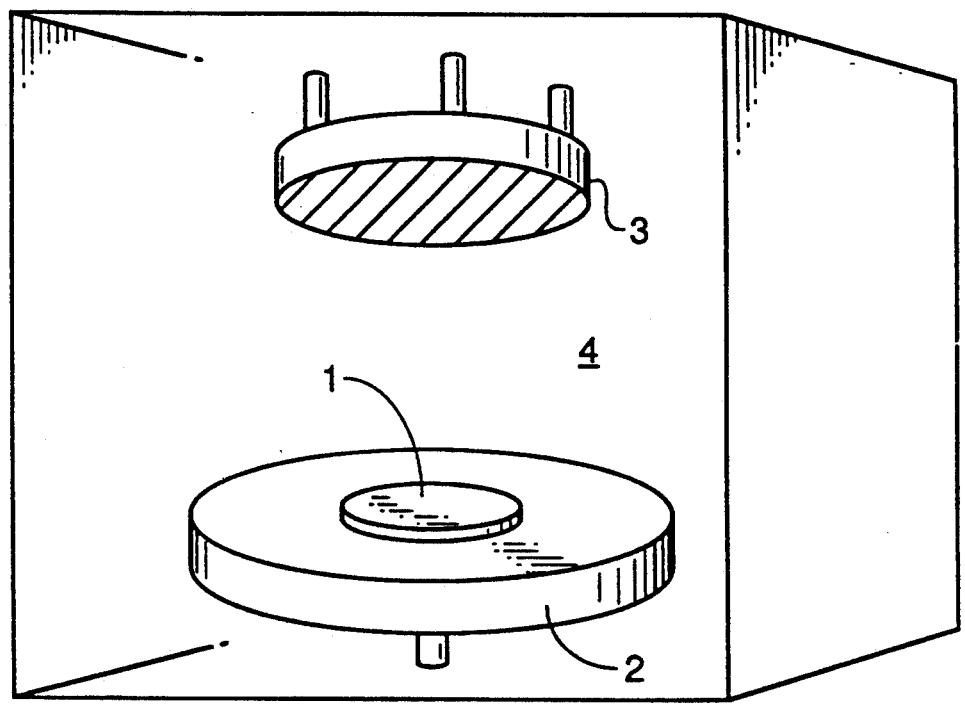

When wafers are processed for the production of integrated circuits, patterning by depositing thin films of materials requires the use of masks. Generally polymeric photoresist materials are used. Naturally, the physical properties of such photoresists must be such that the materials can withstand the aggressive conditions used to etch previously deposited films. The photoresist often becomes contaminated with the material being etched. Thus, photoresist removal processes must consider not only removal of volatilizable organic materials, but also such undesirable residual materials.

Using the invention, we have found that both volatilizable and normally non-volatilizable materials can be quickly and effectively removed at a rate of about two microns per minute, i.e. as fast or faster than in most conventional processes, but without significant substrate damage due to radiation.

The invention is advantageously practiced on any typical materials now commonly used as semiconductor substrate materials such as silicon and gallium arsenide. It is to be understood, however, that the process will be useful in other situations where it is desired to remove organic and inorganic materials from substrates by use of a plasma.

We have found that remote excitation processes are unsatisfactory for the complete removal of residues, and therefore identified the possibility of using direct substrate exposure to the plasma. This, however, as the prior art teaches, typically results in unacceptable radiation damage to the substrate.

We have surprisingly found, however, that the plasma etching process can be directly accomplished (i.e. without use of remote excitation), without radiation damage, by operating in a specified pressure and power range, with the plasma being generated in contact with a face of the substrate which is to be cleaned.

Thus, contrary to the prior art, in the present process a plasma is generated in contact with a face of the substrate without the need for equipment or processes wherein the plasma is created in a location remote from the substrate (and then transporting the plasma to the substrate surface), or the need to refine the plasma in any manner prior to exposing the substrate to it. By "in contact with a face of the substrate" it is meant that plasma is generated in a space between the radiation source and the largest face of a substrate surface (i.e. not simply at the circumference of such substrates as in barrel etch systems) without any shielding or the like between the plasma and the substrate surface.

The present process may utilize any of the commonly used plasma reactants, such as $O_2$, $N_2O$, $CO_2$, $O_3$, $CF_4$, $C_2F_6$, $C_3F_8$, $NF_3$, and the like either alone or in compatible combinations. Damage to the substrate due to radiation generated by the energy source for creating the plasma (e.g. RF, UV or microwave) is minimized by operating at the specified reaction chamber powers and pressures. In addition to its affect in reducing radiation damage, the relatively high specified process pressures also permit very high reaction rates. We have found that the rate of removal of organic material typically exceeds two microns per minute.

The FIGURE shows the relatively simple apparatus within which the method of the invention can be practiced. The method allows such a simple device to be used because the plasma is created in contact with the substrate, and no special baffles or separation strategies are required to avoid radiation emitted from the energy source reaching the substrate.

In the FIGURE, substrate 1, for example a silicon wafer, rests on an electrically isolated heater block 2, which also serves as an RF anode. Above wafer 1 is RF cathode 3 which also serves as a gas delivery "showerhead", thereby providing even distribution of gasses entering the reactor. The RF cathode is connected to a source of RF power by way of an impedance matching network (not shown) as is well known. Process gasses are metered into the showerhead by a standard gas flow control system (not shown). The process chamber, denoted as 4, is evacuated by a standard vacuum pumping system which can be controlled to maintain the desired process pressures.

While only a single RF cathode is shown in the FIGURE it is certainly possible, and in fact preferred, to use more than one cathode within process chamber 4 to provide a system with greater capacity. We prefer to use two cathodes, of the shape shown in the FIGURE, along with a single rectangular anode positioned below the side by side cathodes.

The plasma generating reactants (typically oxygen and fluorocarbon containing gasses) are energized by the RF field to produce ions and neutral radicals of oxygen and fluorine. In the plasma the oxygen radicals convert the high molecular weight polymers of the photoresist into volatile carbon monoxide, carbon dioxide, hydrocarbons, and water vapor. If present, fluorine ions form metal fluorides with the nonvolatile metal contaminants in the polymer and prevent their diffusion into the surface of the substrate. These metal fluorides are water soluble and can be removed with a deionized (DI) water rinse immediately after the stripping process has been completed. The highly reactive fluorine ions also aid the oxygen in the removal of highly cross-linked polymer generated by previous etching processes.

In operation, an RF power level is selected to achieve the desired level of excitation of the process gas mixture, and operating pressure is selected to achieve the optimum energy-to-pressure ratio. As a practical matter the RF power level as measured in watts will range from about 50 to about 600 watts or more per cathode. Below 50 watts it is difficult to ignite and stabilize a plasma. At powers above 600 watts the danger of causing premature device damage due to radiation damage becomes unacceptable.

It is especially preferred to operate in the range of from about 200 to about 500 watts of power at each RF cathode.

Those skilled in the art will understand that the amount of power required to ignite and maintain the plasma is a function of the distance between the RF cathode and the anode. Thus, this distance will be adjusted such that a sufficiently large plasma volume can be generated using an appropriate amount of power. Electrode separation in our device is usually held at about 10 mm, using two cathodes, each 225 mm diameter. A plasma volume of about 400 cm$^3$ for each cathode is generated, where the volume is the surface area of the cathode times the separation between the cathode and anode.

Heater block 2 can be used to increase removal rates, if desired, by raising the temperature of the substrate to between 25° C. and 300° C. While substrate temperature will affect the rate at which the reaction proceeds, it is of utmost importance that the E/P in the reactor be kept within the desired range. That is, the advantages of the invention are achieved by operating in the specified E/P range, taking into account whatever substrate temperature is used. In the most preferred process, the system is operated at a substrate temperature of about 250° C.

At the present time the practical range of pressures which may be used is from about 10 to about 50 torr. At pressures greater than about 50 torr it becomes more difficult to ignite the plasma or to maintain proper gas distribution seen by the substrate surface. At pressures below 10 torr gas distribution is enhanced, but the rate of removal of photoresist becomes unacceptably low. Nevertheless, the advantages of the invention in terms of minimizing radiation damage are obtained even at lower or higher pressures, if the proper E/P value is maintained.

In order to confirm the advantages of the invention tests were run using the single cathode configuration shown in the FIGURE, using a 7 inch diameter cathode and an electrode spacing of 10 mm. At a pressure of 2 torr, using a power of 300 watts (E/P = 0.635) an interface trap density ($D_{it}$) of 4.39 × 10$^{11}$ was obtained, where interface trap density represents a measure of potential radiation damage to the wafer. At 15 torr and 300 watts (E/P = 0.085), a $D_{it}$ of 3.6 × 10$^{11}$ was obtained. Finally at 20 torr and 300 watts (E/P = 0.0635), $D_{it}$ was 2.09 × 10$^{11}$. Control tests were also run, and $D_{it}$ measured. For two wafers from the same wafer batch as above, untreated, $D_{it}$ was measured 1.76 × 10$^{11}$ and 2.02 × 10$^{11}$ respectively. This data clearly shows that radiation damage can be minimized by operating at the preferred conditions of the invention, and that unacceptably higher interface trap density occurs as E/P becomes large. The object of the invention, minimizing radiation damage to the wafer surface, is achieved at lower E/P values. However, either reducing the power-in or raising the pressure will lower the stripping rate and therefore the speed of processing. Slow processing speed makes the cleaning process uneconomical. Thus, the minimum E/P value for operation will be about 0.017, using a pressure of 30 torr at 200 watts and a plasma volume of 400 cm$^3$.

The manner of using an apparatus such as that shown in the FIGURE will now be described. It is preferred that substrates are loaded into the process chamber by some form of automated substrate handling system to reduce contamination inherent in manual substrate handling. It is preferred that some form of vacuum load lock be used to prevent contamination of the process chamber by the ambient environment and to reduce process downtime caused by cycling between atmospheric pressure and process pressure.

If no load lock is used, it is necessary to allow for stabilization of the process environment. This includes stabilization of the process pressure, gas flows, and temperature.

Once the substrates have been loaded and the process environment has stabilized, the process is initiated by activation of the RF power source. The removal process begins and its rate is determined by the material being removed, the temperature of the substrates, the RF power level selected, the oxygen-to-fluorine ratio, and the availability of reactant (determined by gas flow and pressure). In the present process these parameters can be manipulated to achieve the appropriate pressure for a given energy level, so as to operate at an optimum energy/pressure ratio. The products of the reaction (carbon monoxide, carbon dioxide, volatile hydrocarbon, water vapor) and unused reactant are exhausted from the chamber continuously by a vacuum pumping system.

If a load lock is not used, the process chamber is evacuated to base pressure and purged to remove all residual reactant and reaction product. The chamber is then backfilled to atmospheric pressure and opened.

The substrates are removed from the process chamber, again, preferably by means of some automated substrate handling mechanism, and transferred to the next process step.

The substrates, having been removed from the process chamber, are rinsed in deionized water to remove the water soluble metal fluorides formed during the cleaning process.

The invention provides many advantages. Removal of inorganic surface residues increases device yield by reducing ionic contamination. This is made possible by taking advantage of short-lived reactant species which exist only in the plasma state and not in the downstream effluent.

The relatively low energy-to-pressure ratio of the invention reduces the mobility of energetic ions and electrons in three ways. First, the mean free path is shortened and ion/electron energy is bled off in gas phase collisions. Second, the average energy per ion/electron is reduced because the total energy is spread over a larger number of ions/electrons. Third, the lower RF power level results in a lower plasma potential and, therefore, lower electron energies due to DC acceleration.

Reduced processing time (high process rate) is made possible by increasing the reaction chamber pressure to increase the concentration of reactive species. The increased pressure also increases the residence time of reactive species which, in turn, increases the efficiency of utilization of reactant materials.

While only a single embodiment of the invention has been described herein, it is to be understood that many variations of the basic concept of the invention, i.e. the use of relatively high operating pressures in a direct exposure plasma etching process, may be possible. It is intended that such variations, especially those which merely substitute varying reactor geometries or power sources, and or in which the position of the elements used in the process are changed, fall within the scope of the appended method claims.

What is claimed is:

1. A plasma cleaning process for the removal of undesired materials from the surface of a substrate comprising:
   (a) disposing a substrate in a reaction chamber, said reaction chamber including a source of electromagnetic radiation;
   (b) introducing plasma forming gasses into said chamber;
   (c) exposing said gasses to electromagnetic radiation of sufficient power from said source to create a plasma in contact with a face of said substrate; and
   (d) maintaining an operating pressure in the chamber such that the ratio of the power used to create said plasma, as measured in watts per $cm^3$ of said plasma, to said pressure, as measured in torr, is less than about 0.150.

2. The process according to claim 1 wherein said power to pressure ratio is maintained in the range 0.017 to 0.150.

3. The process according to claim 1 wherein said plasma is formed using electromagnetic wave radiation at a power of from about 50 to about 500 watts.

4. The process according to claim 1 wherein said plasma is maintained at a pressure of from about 10 torr to about 50 torr.

5. The process according to claim 1 wherein said substrate is a wafer selected from the group consisting of silicon or gallium arsenide.

6. The process according to claim 4 wherein said undesired materials include a polymeric photoresist.

7. The process according to claim 1 wherein said gasses include a fluorine containing gas.

8. The process according to claim 6 wherein said photoresist is contaminated with metals.

9. The process according to claim 7 comprising the further step of rinsing said substrate in deionized water.

10. The process according to claim 1 wherein said gasses are selected from the group consisting of $O_2$, $N_2O$, $CO_2$, $O_3$, $CF_4$, $C_2F_6$, $C_3F_8$, $NF_3$ and compatible combinations thereof.

11. The process according to claim 2 wherein said electromagnetic radiation is selected from the group consisting of UV, RF and microwave.

12. The process according to claim 1, further comprising the step of providing heat conductively to said substrate.

13. The process of claim 1, further comprising the steps of:
   providing a support having a principal surface on which said substrate is disposed; and
   locating said source of electromagnetic radiation about 10 mm from said principal surface.

14. The process of claim 1, further comprising the step of providing a second source of electromagnetic radiation, said second source being located adjacent the source of electromagnetic radiation.

15. The process of claim 1, wherein said gasses are provided via a passage formed in said source of electromagnetic radiation.

16. A wafer photoresist plasma cleaning method comprising the steps of:
   (a) disposing a wafer in a reaction chamber including a source of electromagnetic radiation;
   (b) introducing plasma forming gasses into said chamber in a space between said source and a surface of said wafer which has been layered with polymeric photoresist; and
   (c) exposing said gasses to electromagnetic radiation of sufficient power to generate a plasma in contact with said face of said wafer while maintaining an operating pressure and power input such that the ratio of power input, as measured in watts per $cm^3$ of said plasma, to pressure, as measured in torr, is less than about 0.150.

17. The process according to claim 16 wherein said ratio of power to pressure is maintained in the range of 0.017 to 0.150.

18. The process according to claim 16 wherein said plasma is formed using radiation at a power of from about 50 to about 500 watts.

19. The process according to claim 16 wherein said plasma is maintained at a pressure of from about 10 to about 50 torr.

20. The process according to claim 16 wherein said wafer is formed of a material selected from the group consisting of silicon and gallium arsenide.

21. The process according to claim 18 wherein said gasses include a fluorine containing gas.

22. The process according to claim 20 wherein said photoresist is contaminated with metals.

23. The process according to claim 21 comprising the further step of rinsing said substrate in deionized water.

24. The process according to claim 16 wherein said gasses are selected from the group consisting of $O_2$, $N_2O$, $CO_2$, $O_3$, $CF_4$, $C_2F_6$, $C_3F_8$, $NF_3$ and compatible combinations thereof.

25. The process according to claim 17 wherein said radiation is selected from the group consisting of UV, RF and microwave.

26. An apparatus adapted for the removal of undesired materials from the surface of a substrate comprising:
   an electrically isolated and conductive support for the substrate, said support having a principal surface on which said substrate is disposed;
   a source of electromagnetic radiation located about 10 mm from said principal surface, said source defining a passage;
   means for providing gas to said passage, wherein said electromagnetic radiation creates from said gas a plasma in contact with a face of said substrate; and
   a reaction chamber housing said support and said source.

27. The device of claim 26, further comprising means for heating said support.

28. The device of claim 26, further comprising a second source of electromagnetic radiation located adjacent to said source.

29. The device of claim 26, wherein said source has a diameter of about 225 mm.

30. The device of claim 26, wherein said principal surface is rectangular in shape.

31. An apparatus adapted for the removal of undesired materials from the surface of a substrate comprising:
   an electrically isolated and conductive support for the substrate, said substrate having a rectangular principal surface on which said substrate is disposed;
   means for conductively heating said support;
   a first source of electromagnetic radiation located about 10 mm from said principal surface, said source defining a first passage;
   a second source of electromagnetic radiation located adjacent to said first source, and defining a second passage;
   means for delivering gas to said first and second passages, wherein the electromagnetic radiation from said first and second sources creates a plasma in contact with a face of said substrate from respectively the gas delivered to said first and second passages; and
   a reaction chamber housing said first and second sources and said support;
   wherein a ratio of the power used to create said plasma, as measured in watts per $cm^3$ of said plasma, to an operating pressure in said chamber, as measured in torr, is less than about 0.150.

* * * * *